US010027367B2

(12) United States Patent
Heiskanen et al.

(10) Patent No.: US 10,027,367 B2
(45) Date of Patent: Jul. 17, 2018

(54) QUARTER WAVELENGTH UNIT DELAY AND COMPLEX WEIGHTING COEFFICIENT CONTINUOUS-TIME FILTERS

(71) Applicant: NOKIA SOLUTIONS AND NETWORKS OY, Espoo (FI)

(72) Inventors: Antti Heiskanen, Oulu (FI); Eero Koukkari, Oulu (FI)

(73) Assignee: NOKIA SOLUTIONS AND NETWORKS OY, Espoo (FI)

( * ) Notice: Subject to any disclaimer, the term of this patent is extended or adjusted under 35 U.S.C. 154(b) by 0 days.

(21) Appl. No.: 14/829,310

(22) Filed: Aug. 18, 2015

(65) Prior Publication Data

US 2017/0054469 A1   Feb. 23, 2017

(51) Int. Cl.
| | | |
|---|---|---|
| H04B 1/44 | (2006.01) | |
| G08C 13/00 | (2006.01) | |
| H03H 15/00 | (2006.01) | |
| H04B 3/08 | (2006.01) | |
| H04B 3/23 | (2006.01) | |
| H04L 5/14 | (2006.01) | |
| H04L 25/03 | (2006.01) | |
| H04L 27/36 | (2006.01) | |

(52) U.S. Cl.
CPC .............. *H04B 1/44* (2013.01); *G08C 13/00* (2013.01); *H03H 15/00* (2013.01); *H03H 15/023* (2013.01); *H04B 3/08* (2013.01); *H04B 3/232* (2013.01); *H04L 5/14* (2013.01); *H04L 5/1461* (2013.01); *H04L 25/03878* (2013.01); *H04L 25/03885* (2013.01); *H04L 27/366* (2013.01)

(58) Field of Classification Search
CPC ..................................................... H04B 3/232
See application file for complete search history.

(56) References Cited

U.S. PATENT DOCUMENTS

| | | | |
|---|---|---|---|
| 6,047,022 A | 4/2000 | Reuven | |
| 6,252,461 B1 | 6/2001 | Raab | |
| 6,392,481 B1 | 5/2002 | Kurttio | |
| 6,587,514 B1 | 7/2003 | White et al. | |
| 6,658,045 B1 | 12/2003 | Jin | |
| 2002/0172265 A1* | 11/2002 | Kenney | H04B 1/7107 375/148 |

(Continued)

OTHER PUBLICATIONS

U.S. Office Action U.S. Appl. No. 14/829,315 dated May 25, 2016.

(Continued)

*Primary Examiner* — Hsin-Chun Liao
(74) *Attorney, Agent, or Firm* — Squire Patton Boggs (US) LLP

(57) ABSTRACT

Various signal processing techniques may benefit from appropriate handling. For example, certain signal processors may benefit from quarter wavelength unit delay and complex weight coefficient continuous-time filters. A method can include splitting an input signal into a plurality of signal paths. The method can also include complex weighting, for each signal path, a respective signal. The method can further include summing outputs of the signal paths. The method can additionally include providing an output comprising the sum of the signal paths. The complex weighting can be configured to independently control gain, phase and delay of the output signal over broadband.

20 Claims, 12 Drawing Sheets

(56) References Cited

U.S. PATENT DOCUMENTS

| | | | |
|---|---|---|---|
| 2004/0122627 | A1 | 6/2004 | Kybett et al. |
| 2005/0152487 | A1 | 7/2005 | Reichard |
| 2005/0212691 | A1* | 9/2005 | Tirkel ............ G01V 8/005 342/22 |
| 2006/0240786 | A1 | 10/2006 | Liu |
| 2007/0036238 | A1 | 2/2007 | Matero et al. |
| 2008/0310573 | A1 | 12/2008 | Lewis et al. |
| 2009/0052597 | A1 | 2/2009 | Wang et al. |
| 2011/0241939 | A1* | 10/2011 | Maenpa ............ G01S 19/18 342/368 |
| 2014/0116236 | A1 | 5/2014 | Roebroeks et al. |
| 2014/0219139 | A1 | 8/2014 | Choi et al. |
| 2015/0155899 | A1 | 6/2015 | Webb et al. |

OTHER PUBLICATIONS

U.S. Office Action U.S. Appl. No. 14/829,296 dated Apr. 19, 2016.
Dinesh Bharadia, et al.; "Full Duplex Radios"; SIGCOM'13, Aug. 12-13, 2013; 12 pages.
Steven Hong, et al.; "Picasso: Flexible RF and Spectrum Slicing"; SIGCOMM'12, Aug. 13-17, 2012, Helsinki; 12 pages.
M. Neinhus, et al.; "Concept of Microwave Electronic Steered Array using Analogue FIR-Filter"; GeMiC 2005; pp. 121-124.
Klaus Solbach, et al.; "Microwave Analogue FIR-Filter"; University Dusiburg-Essen; 3 pages.
Xiaofeng Lin, et al.; "A 2.5- to 3.5-Gb/s Adaptive FIR Equalizer With Continuous-Time Wide-Bandwidth Delay Line in 0.25-μm CMOS", IEEE Journal of Solid-State Circuits, vol. 41, No. 8; Aug. 2006; pp. 1908-1918; IEEE 2006.
Jonathan Sewter, et al.; "A 3-Tap FIR Filter With Cascaded Distributed Tap Amplifiers for Equalization Up to 40 Gb/s in 0.18-μm CMOS"; IEEE Journal of Solid-State Circuits, vol. 41, No. 8; Aug. 2006; pp. 1919-1929; IEEE 2006.
Danial Ehyaie; "Novel Approaches to the Design of Phased Array Antennas"; A dissertation thesis; University of Michigan, 2011.
Freescale Semiconductor; "Advanced Doherty Alignment Module (ADAM)"; Rev. 2, Jan. 2015; Document No. MMDS20254H; pp. 16.
Alison M. Smith; "A Wideband Adaptive Feedforward Amplifier Lineariser"; A Thesis submitted in Partial Fulfillment of the Requirements for the Degree of Master of Applied Science; Aug. 1997, pp. 125.
Jim Cavers, et al.; "Wideband Linearization: Feedforward plus DSP"; Workshop WMD, Engineering Science, Canada; pp. 40.
Ada S. Poon, et al.; "Supporting and Enabling Circuits for Antenna Arrays in Wireless Communications"; Proceedings of the IEEE, vol. 100, No. 7, Jul. 2012; pp. 2207-2218.
Wang Xiaohua, et al.; "Design of Complex FIR Filters with arbitrary Magnitude and Group Delay Responses"—only Abstract; IEEE Oct. 2009; http://ieeexplore.ieee.org/stamp/stamp.jsp?tp=&arnumber=6074529&isnumber=6074519.
European Search Report issued in corresponding European Application No. 16175610.1 dated Dec. 19, 2016.

* cited by examiner

QUARTER WAVELENGTH UNIT DELAY AND COMPLEX WEIGHTING COEFFICIENT CONTINUOUS-TIME FILTERS

BACKGROUND

Field

Various signal processing techniques may benefit from appropriate handling. For example, certain signal processors may benefit from quarter wavelength unit delay and complex weight coefficient continuous-time filters.

Description of the Related Art

Various modulation methods are used to transmit wanted information through communication media to the receiver. Continuous-mode signals can be used within the signal transmission whether the transmission is binary or amplitude and/or phase modulated signal. The continuous-time domain signal can be distorted within the transmission. Sometimes the transceiver analog domain parts cause most of the signal linear and nonlinear distortion.

The signal distortion may need to be minimized through optimizing circuit and system level design. Further minimization can be done through adaptive equalization, possibly using both digital signal processing (DSP) and analog signal processing (ASP). ASP can be useful within full-duplex radios where the strong transmission (TX) signal is transmitted simultaneously at the same frequency as the possibly weaker reception (RX) signal is received.

In practice, part of the TX signal leaks to the receiver signal paths and sums up with the wanted received RX signal. Removing the leaked TX signal from the receiver paths can aid in correct reception of the wanted RX signal, namely reception with sufficient signal purity.

Cancellation of the leaked TX signal, however, is not an easy task. One complication may be due to the leakage TX signal being affected by per frequency amplitude, phase and delay changes during the leakage mechanisms. The leakage mechanisms can include conductions, reflections, radiation, and so on.

Furthermore, the mentioned frequency response characteristics may significantly differ over broadband. Therefore, the ASP-circuit may be useful within full-duplex radio. The ASP unit can be used in feedforward manner a copy/sample of TX signal can be taken. Signal characteristics of the copy can be altered with ASP and the altered TX signal can be fed forward to the receiver path so that the unwanted leakage TX signal is cancelled. This TX leakage cancellation may be especially challenging when the wanted signals are broadband. For broadband signals, including multi-carrier, carrier aggregation, multi-band, and so on, the required analog signal processing within feeding forward the TX signal to RX can be much more complex.

More generally, within many telecommunication systems there is the need for signal delay and/or frequency response control over broad band. While DSP can handle very complex signal processing tasks, other times analog signal processing may be useful. For example, within full-duplex radio the TX to RX isolation requirement may be so high that it cannot be achieved without ASP based signal cancellation. Signal processing via continuous-time analog circuitry is much more difficult in practice compared to DSP. There are number of continuous-time domain techniques on attenuating/amplifying, delaying or phase shifting the signal, and they are widely used. However, there are not many techniques on how to combine all required signal processing tasks while maintaining broadband performance.

FIG. 1 illustrates the operation principle of analog adjustable attenuator/gain, phase, and delay. The graphs illustrate what happens to the signal at the output of individual signal processing element over broadband. Ideally the adjustable attenuator/gain is broadband device but it does not alter the delay or phase offset while attenuation/gain is changed. The adjustable phase shifter is also ideally a broadband device but it only adjusts the signal phase offset. Hence, delay and attenuation are not changed while the phase offset is changed. Likewise, ideally the delay adjustment circuit can adjust the delay, namely adjust the phase response slope, but the attenuation and phase offset remains unchanged. All these signal processing tasks can be performed today with several different analog circuit methods. There are significant number of different adjustable attenuator/amplifier circuits, phase sifters and delay adjustment circuits.

There are also hybrid solutions that combine at least two functions. Reflection type I&Q vector modulator, for example, can adjust phase offset and attenuation independently. Hence, in practice, complex gain element can be achieved.

The above basic signal processing functions, or hybrids of those, is that they offer performance that is already limited, even in theory. Adjustable attenuator/gain cannot adjust amplitude slope or ripple over a target band. A phase shifter cannot adjust phase slope or ripple over a target band and a delay element cannot adjust phase offset over a target band, only phase slope is adjusted. These limitations may be unsuitable for broadband high performance.

SUMMARY

According to certain embodiments, a method can include splitting an input signal into a plurality of signal paths. The method can also include complex weighting, for each signal path, a respective signal. The method can further include summing outputs of the signal paths. The method can additionally include providing an output comprising the sum of the signal paths. The complex weighting can be configured to independently control gain, phase and delay of the output signal over broadband.

In certain embodiments, an apparatus can include a splitter configured to split an input signal into a plurality of signal paths at a first end of the signal paths. Each signal path can include at least one attenuator and at least one delay element. The apparatus can also include a summer configured to sum the signal paths at a second end of the signal paths opposite the first end of the signal paths. The apparatus can be configured to independently control gain, phase and delay of the output signal over broadband.

An apparatus, according to certain embodiments, can include means for splitting an input signal into a plurality of signal paths. The apparatus can also include means for complex weighting, for each signal path, a respective signal. The apparatus can further include means for summing outputs of the signal paths. The apparatus can additionally include means for providing an output comprising the sum of the signal paths. The complex weighting can be configured to independently control gain, phase and delay of the output signal over broadband.

An apparatus, according to certain embodiments, can include means for splitting an input signal into a plurality of signal paths. The apparatus can also include means for complex weighting, for each signal path, a respective signal. The apparatus can include means for summing outputs of the signal paths. The apparatus can additionally include means for providing an output comprising the sum of the signal paths. Each of the complex weighted signal paths may have an individual filter.

BRIEF DESCRIPTION OF THE DRAWINGS

For proper understanding of the invention, reference should be made to the accompanying drawings, wherein.

DETAILED DESCRIPTION

Figure 1:
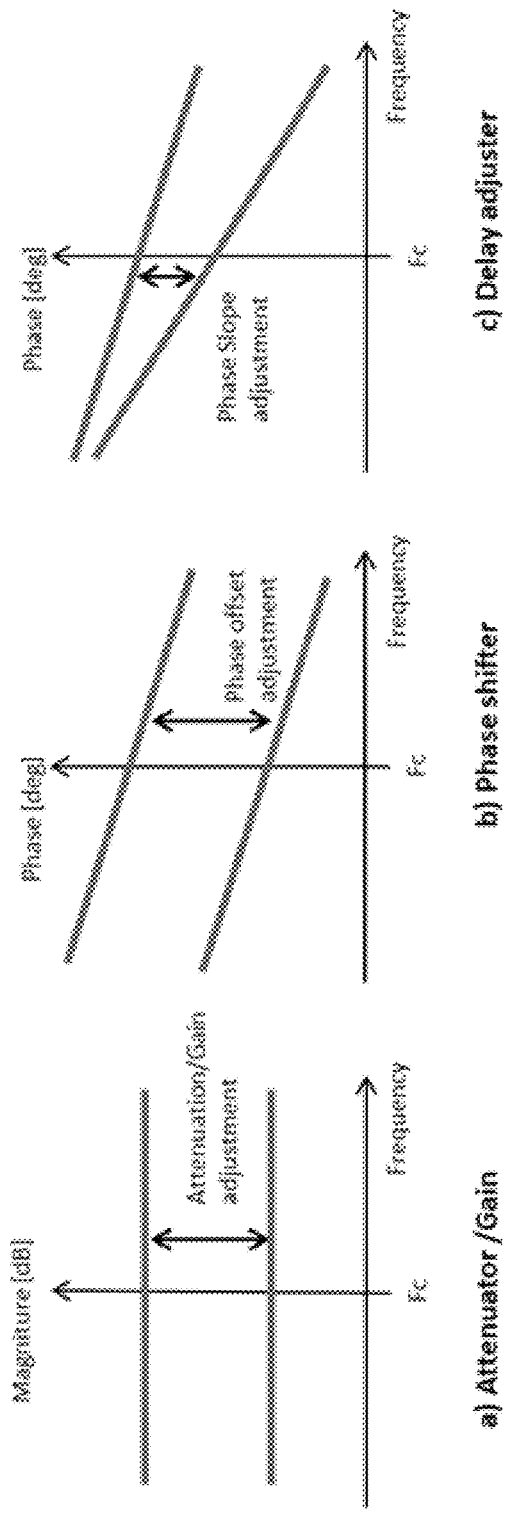
FIG. 1 illustrates the operation principle of analog adjustable attenuator/gain, phase, and delay.

Certain embodiments relate to telecommunication system frequency response and delay control at analog domain. More particularly, certain embodiments relate to analog domain signal processing (ASP) circuit within telecommunication system. Circuit architecture capable of adjusting amplitude response, phase response and group delay over broadband is presented. The circuit could be called continuous-time filter or analog FIR filter depending on how the circuit elements are selected and dimensioned.

Certain embodiments provide circuitry that is capable of controlling gain, phase and delay over broadband with flexibility and independency of each other. Certain embodiments of an ASP-circuit can be used to combine all the above signal processing tasks and each task can be performed independently over broad bandwidth. Also, simplified versions of certain embodiments can perform simpler tasks but over broadband.

Certain embodiments of the described ASP-circuits can be considered to belong to a group of analog domain finite impulse response (FIR)-like filters or into group of continuous-time filters. Within this kind of technique, there can be a nominal delay created by the circuit itself and then a group of signal paths where one or more path can have fractional delay(s) relative to the nominal delay. Thus, there can be signal paths that are shorter or longer than the nominal delay. By weighting each signal from each differently delayed signal path and summing the output, FIR-like frequency response tuning capabilities can be achieved.

Certain embodiments can adjust the circuit nominal delay within the limits set by the fractional delays and used coefficient type and number of signal paths. This process can be referred to as sinc-interpolation. There may be significant difference in the circuit frequency response tuning capabilities depending on what kind of fractional delays and weighting coefficients are used, and how many FIR-taps are used.

Certain embodiments of an ASP-circuit can contain more than one nominal delay and a group of fractional delayed and complex weighted signal paths. Thus, it is possible to cancel signals with more than one dominant delay. For example, in TX leakage signal cancellation there may be two different delayed reflection signals within an RX path.

Thus, certain embodiments of the ASP-circuit may provide a way to independently adjust signal amplitude, phase and delay response over broadband. Certain embodiments split the wanted input signal, for example a copy of a TX signal, into N couple of individual signal paths. Each individual signal path can then have adjustable analog circuit elements with the characteristics of attenuators/amplifiers, amplitude and phase shifters/vector modulators. Furthermore, each of the individual signal paths can have an analog delay element whose delay may be an integer multiple of a pre-defined fixed delay or may be selected individually for each independent signal path. Furthermore, each of the independent signal paths may contain an individual analog filter. Furthermore, the outputs of each independent signal path with selected tenable analog elements can be summed/subtracted to form the final output of the ASP-circuit.

A desired ASP function can be achieved by defining the number of signal paths and elements within each path. The tuning range of the ASP-circuit can also be defined with those selections. Hence, certain embodiments of the ASP-circuit can be adaptive and can be optimized for a target system, based on a desired input-output function and tuning range. The adaptation of the ASP-circuit can also reduce the non-ideal effects within the ASP-circuit itself.

Figure 2:
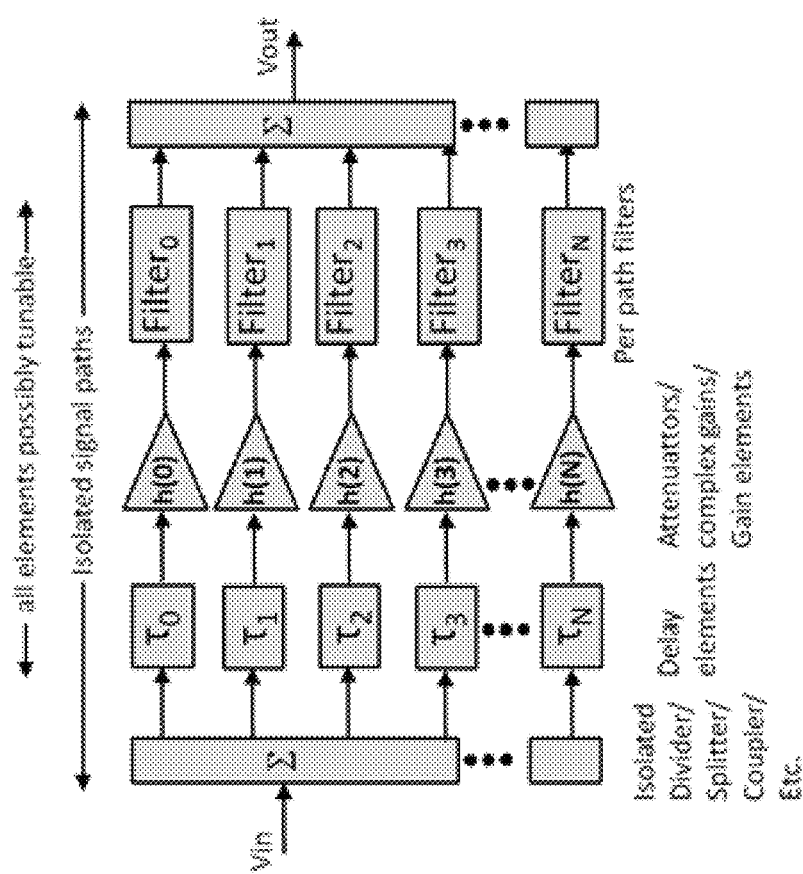
FIG. 2 shows a general architecture of an ASP-circuit according to certain embodiments.

FIG. 2 shows a general architecture of an ASP-circuit according to certain embodiments. The filters within each isolated signal path can be considered to be part of natural per signal path characteristics or the filters can be implemented intentionally. For example, in the case of carrier aggregation the ASP-circuit can be split to perform ASP task for both carriers independently. The filters could be used to isolate the carriers from each other in such a case.

Also, the fractional delay elements can be used to construct more than one nominal delay. The fractional delays can be delay differences related to the nominal delay. This way, the input signal can be split into more than one fractional tunable signal paths. For example, a group of N–M signal paths can be used to adjust frequency response of one delay and a group of M signal paths can be used to adjust frequency response of other delay, and so on.

As can be seen from the general architecture in FIG. 2, there may be some similarity to DSP FIR architecture. However, the circuit according to certain embodiments can operate at continuous-time domain. The DSP theories can still be partly used for showing the capabilities of certain embodiments, taking the sampling frequency to be infinite. The isolation between signal paths is not mandatory due to the adaptive nature of the solution.

Certain embodiments may be able to adjust at continuous-time domain the output signal amplitude response, phase response and delay response over broad band. The frequency response phasor presentation of certain embodiments of an ASP-circuit can be approximated with equation (1), when only weighting coefficients $h_N$ are tunable in this example case:

$$v_{out}(\omega) = v_{in}(\omega) \cdot |H_0(\omega, h_0)| \cdot e^{-j(\omega \tau 0 + arg(H_0(\omega, h_0)))} + \quad (1)$$
$$v_{in}(\omega) \cdot |H_1(\omega, h_1)| \cdot e^{-j(\omega \tau 1 + arg(H_1(\omega, h_1)))} +$$
$$v_{in}(\omega) \cdot |H_2(\omega, h_2)| \cdot e^{-j(\omega \tau 2 + arg(H_2(\omega, h_2)))} +$$
$$v_{in}(\omega) \cdot |H_3(\omega, h_3)| \cdot e^{-j(\omega \tau 3 + arg(H_3(\omega, h_3)))} +$$
$$v_{in}(\omega) \cdot |H_4(\omega, h_4)| \cdot e^{-j(\omega \tau 4 + arg(H_4(\omega, h_4)))} + \ldots +$$
$$v_{in}(\omega) \cdot |H_N(\omega, h_N)| \cdot e^{-j(\omega \tau N + arg(H_N(\omega, h_N)))}$$

In equation (1), $\omega$ is the angular frequency of interest, $h_N$ defines per signal path weight, $\tau N$ defines per signal path delay, and $|H_N(\omega, h_N)|$ and $arg(H_N(\omega, h_N))$ represent the amplitude and phase response of individual signal path. These variables can be tunable or can be what comes naturally by the analog design. The output in (1) can represent the output of the circuit in FIG. 2 in a case when per signal path delay is not tunable and there is sufficient isolation between independent signal paths.

The output delay can still be adjusted by adjusting the coefficient values $h_N$. Also, the coefficients $h_N$ can be expressed within the frequency response function due to the nature of analog solution and due to the presence of possible per signal path additive filter. Hence, there may be similarity to digital domain FIR filter whose generally known output would be expressed as (2)

$$v_{out}(\omega) = \quad (2)$$
$$v_{in}(\omega) \cdot h_0 \cdot e^{-j(\omega \tau 0)} + v_{in}(\omega) \cdot h_1 \cdot e^{-j(\omega \tau 1)} + v_{in}(\omega) \cdot h_2 \cdot e^{-j(\omega \tau 2)} +$$
$$v_{in}(\omega) \cdot h_3 \cdot e^{-j(\omega \tau 3)} + v_{in}(\omega) \cdot h_4 \cdot e^{-j(\omega \tau 4)} + \ldots + v_{in}(\omega) \cdot h_N \cdot e^{-j(\omega \tau N)},$$

because within the digital domain the coefficients do not have frequency dependency and the delays are ideal. The DSP FIR responses as a function of per delay path weighting $h_N$ can be determined according to any way described in typical textbooks. Similarly, coefficients can be selected based on desired fractional delay, low pass filter and so on. Within DSP there is also ideal isolation between differently delayed signal paths. In certain cases, reasonable isolation may be achieved within the analog solution as well. Due to the analog solution, in reality each signal path may be slightly affected by all signal weights, delay selection and input signal amplitude because in practice there may not be perfect isolation nor perfect linearity nor RF match. Simplifications and linear analysis can be used to for purposes of explanation and illustration without requiring perfection in practice.

Non-idealities can be such that the non-idealities can be minimized through implementation design. Moreover, non-idealities may be partly minimized within the adaptation process as well, when the ASP-circuit is used within a system. The implementation can also define nominal electrical delay that is not shown within the expression. Such delay can be considered to be part of each fractional delay element. Therefore, the delay can be adjusted around the total nominal delay. In case of complex coefficients, negative group delay can also be achieved.

Certain embodiments may be able to adjust the output delay independently, to provide a desired group delay. The amplitude response of ideal delay is unity and the frequency response can be presented as shown in equation 3:

$$H(\omega) = 1 \cdot e^{-j(\omega \tau_t)} \quad (3)$$

In the case of DSP FIR filter or analog solution shown in FIG. 1, if the target delay $\tau_t$ in (3) does not exactly equal any delay paths within (1) or (2), the target delay $\tau_t$ can be approximated by summing suitable weighted and delayed signals. First hand approximation for such filter coefficients are given by the sinc-function which is time sifted so that the peak value occurs at the location of the target delay $\tau_t$. Hence, the solution in (1) can be used to produce fractional delay.

By adding ideal gain or attenuator, there can be amplitude level adjustment. In the case of DSP fractional delay FIR filter, the FIR filter impulse response, and the corresponding weighting values hN, can be samples of continuous-time sinc-function whose peak value is shifted in time to the target delay location. That delay can be generated with the selected FIR coefficients.

However, to achieve the ideal delay conventionally, the number of required FIR coefficients would be infinite. In certain embodiments, the number of FIR taps can be reduced and the value of each remaining coefficient can be slightly altered so that the target delay is achieved while maintaining maximally flat amplitude response. The same fractional delay functionality can be achieved in certain ASP-circuits according to certain embodiments, when the per signal path unit delays are integer multiples of a pre-defined unit delay. This pre-defined unit delay can be designated as Ts in this example. Hence, the $\tau_{0-N}$ within equation 1 would become n*Ts, when n=0 ... N. Some of the n*Ts delayed signal paths would be shorter than the nominal delay and some would be longer than the nominal delay, some signal paths may have delay equal to the nominal delay. By weighting each fractionally delayed signal paths, the circuit nominal delay can be altered.

Figure 3:
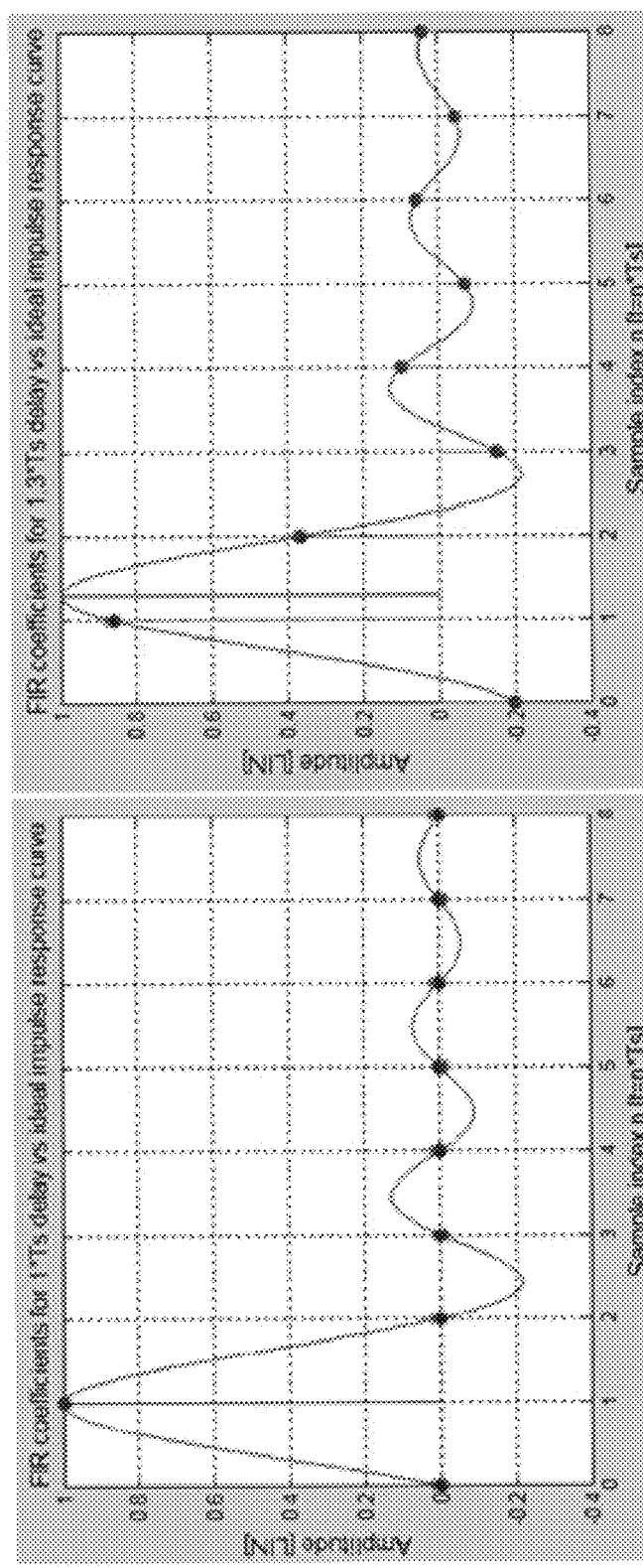
FIG. 3 shows an ideal delay element impulse response curve for example target delays of 1*Ts and 1.3*Ts.

FIG. 3 shows an ideal delay element impulse response curve for example target delays of 1*Ts and 1.3*Ts. Corresponding target delay can be approximated and produced with FIR having coefficient values hn (h0, h1, ... hn*Ts) defined as samples of the ideal delay impulse response curve at corresponding n*Ts time interval).

Thus, FIG. 3 illustrates FIR coefficients as samples of system impulse response, with delay examples, where Ts corresponds to AFIR unit delay. FIG. 3 shows, as dots, nine first ideal required per signal path weighting values of target delay output of 1*Ts and 1.3*Ts. These values can be called FIR coefficients while the system is a continuous-time solution. As can be seen, when the unit delay Ts is fixed, one can adjust the system output nominal delay.

The so called sinc-interpolation based fractional delay adjustment described above can provide the possibility to get wanted fractional delay output but at the same time can force the amplitude response to be ideally unity, while the phase response can be defined by the target delay. This may be not satisfactory because, for example in the case of full-duplex radio, the phase offset and amplitude response may need to be adjusted as well, over broadband.

Two systems with equal delay do not necessarily have the same phase offset. For example, a basic amplifier may have the same delay as a portion of transmission line at a target frequency or band but the phase may be up to 180 degree different due to an active device, bias and matching related phase shifts.

For non-integer delay output target, there may need to be both positive and negative FIR coefficient values (as already seen in FIG. 3). Further, coefficients whose polarity can be altered may be needed if above one unit delay, here Ts, delay adjustment range is desired. Further, coefficients whose magnitude can be as close to zero (high attenuation) as possible may be needed as seen in FIG. 3 when the target delay is exactly the delay of one signal path.

To provide for these or other benefits, certain embodiments provide for complex coefficients. Also, within certain embodiments all signal paths may have the strongest signal. This may be useful for wide delay adjustment range because the strongest or two strongest signals may be nearest to the target nominal delay, as seen in FIG. 3.

For example, if the target delay would be exactly 4*Ts, then only the 4th signal path may be used, while all others may be zeroed. Such wide delay adjustment range may not be possible if each signal path cannot contain the strongest signal. With complex coefficients and the possibility for wide dynamic range per signal path complex gain weighting, certain embodiments can adjust all three target parameters independently, amplitude response, phase response and delay within limitations of selected ASP-circuit element values and number of signal paths. Even negative group delay can be achieved.

If the electrical unit delay is selected to be exactly a quarter wavelength, referenced to an RF signal center frequency, the system can achieve constant group delay phase shifter response or constant group delay amplitude slope adjuster response while using real valued weighting coefficients. For example, with three coefficients and a quarter wavelength delay being used, the frequency response of the proposed ASP-circuit (refer to FIG. 2 and equation (1) having only delayed paths $\tau_{0-2}$) can be approximated with equation 4:

$$H(\omega)=h_0+h_1 \cdot e^{-j(\omega\tau)}+h_2 \cdot e^{-j(\omega 2\tau)} \quad (4)$$

Figure 4:
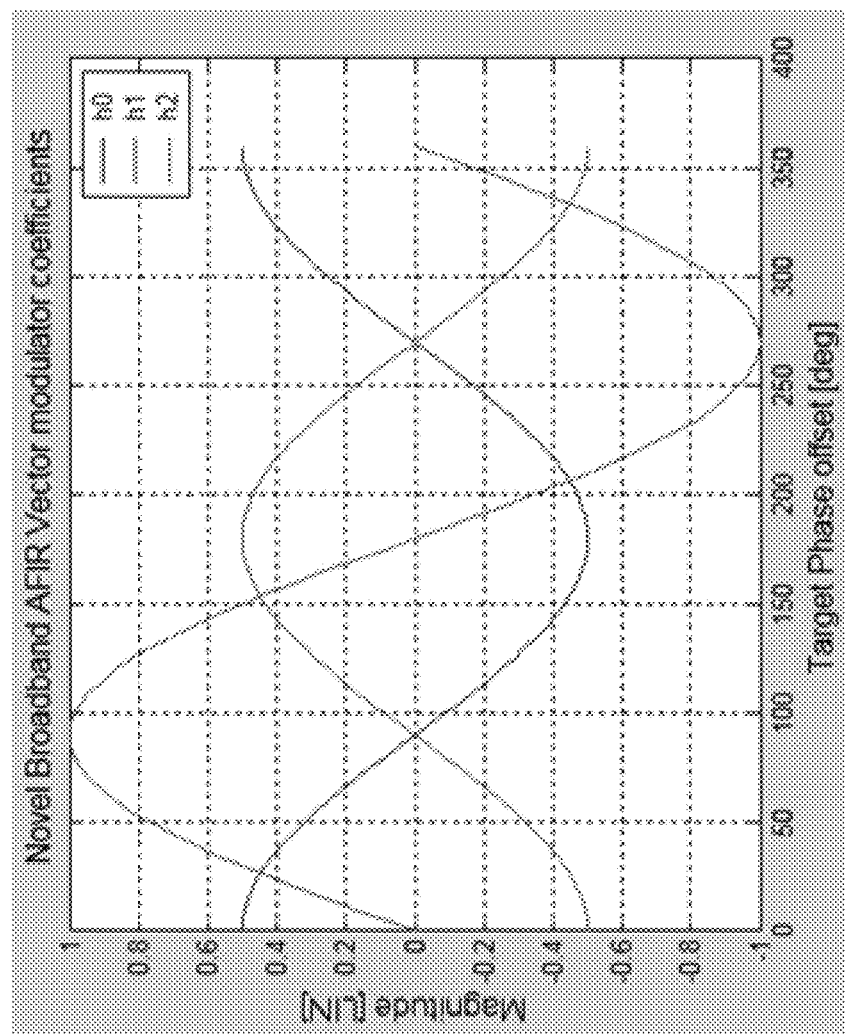
FIG. 4 illustrates coefficients values of three-coefficient AFIR VM for 0-360 degree output phase rotation, according to certain embodiments.

In certain embodiments, benefit may arise from the 90 degree electrical unit delay and by selecting the coefficients as shown in FIG. 4. With these coefficient values, broadband vector modulator output may be achieved while using real valued coefficients, including bi-phase attenuators/gain elements.

FIG. 4 illustrates coefficients values of three-coefficient AFIR VM for 0-360 degree output phase rotation, according to certain embodiments. The output phase can be rotated while keeping the output magnitude relatively constant if one uses coefficients values shown in FIG. 4. The first signal path (h0) has zero delay, the second signal path (h1) has 90 degree delay and the $3^{rd}$ signal path (h3) has 180 degree delay.

The y-axis in FIG. 4 represents per coefficient polarity and magnitude for each target output phase rotation which is shown on the x-axis. For example, if unity magnitude and zero phase output is wanted the coefficient values h0,h1,h2 are 0.5,0,−0.5 respectively. Thus, the 90 degree signal path output is zeroed with h1=0, and the 180 degree signal path (h2) output is added coherently with the zero degree signal path (h1) output signal because the h2=−0.5.

If unity output and 90 degree phase rotation is wanted the coefficients h0,h1,h2 would be 0,1,0 correspondingly. Now the zero (h0) and 180 degree (h2) delayed signal paths are zeroed by h0,h1 and the output comes solely from the 90 degree delayed signal path output (h1=1).

Similarly for all target delays shown in x-axis, the required coefficients h0,h1,h2 can be seen. Furthermore, attenuation or amplification can be added to the output as well, just by scaling the coefficient values seen in FIG. 4. Thus, broad band vector modulator (i.e. complex gain or complex coefficient) functionality can be achieved without using vector modulator circuit. The above described circuit may be used as complex coefficients within the architecture in FIG. 2.

Figure 5:
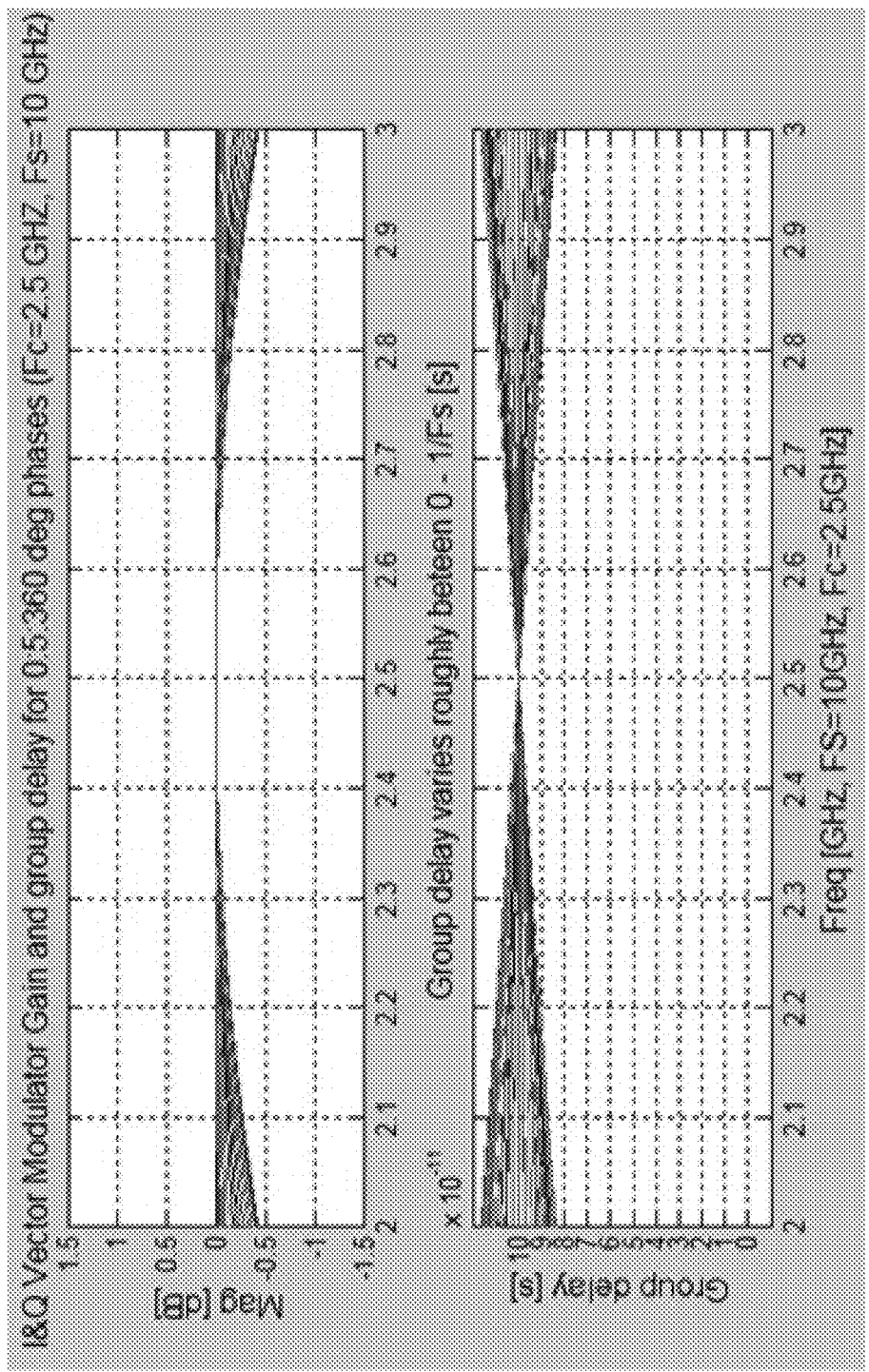
FIG. 5 illustrates corresponding amplitude and group delay response for 0-360 degree phase shift, according to certain embodiments.

FIG. 5 illustrates corresponding amplitude and group delay response for 0-360 degree phase shift, according to certain embodiments. In FIG. 5, Ts=1/(2.5 GHz). By adding more AFIR stages (3, 5, 7,-coefficient FIR) one can improve the bandwidth and group delay performance even further. As can be seen in FIG. 5, a relatively uniform broadband output can be provided.

Figure 6:
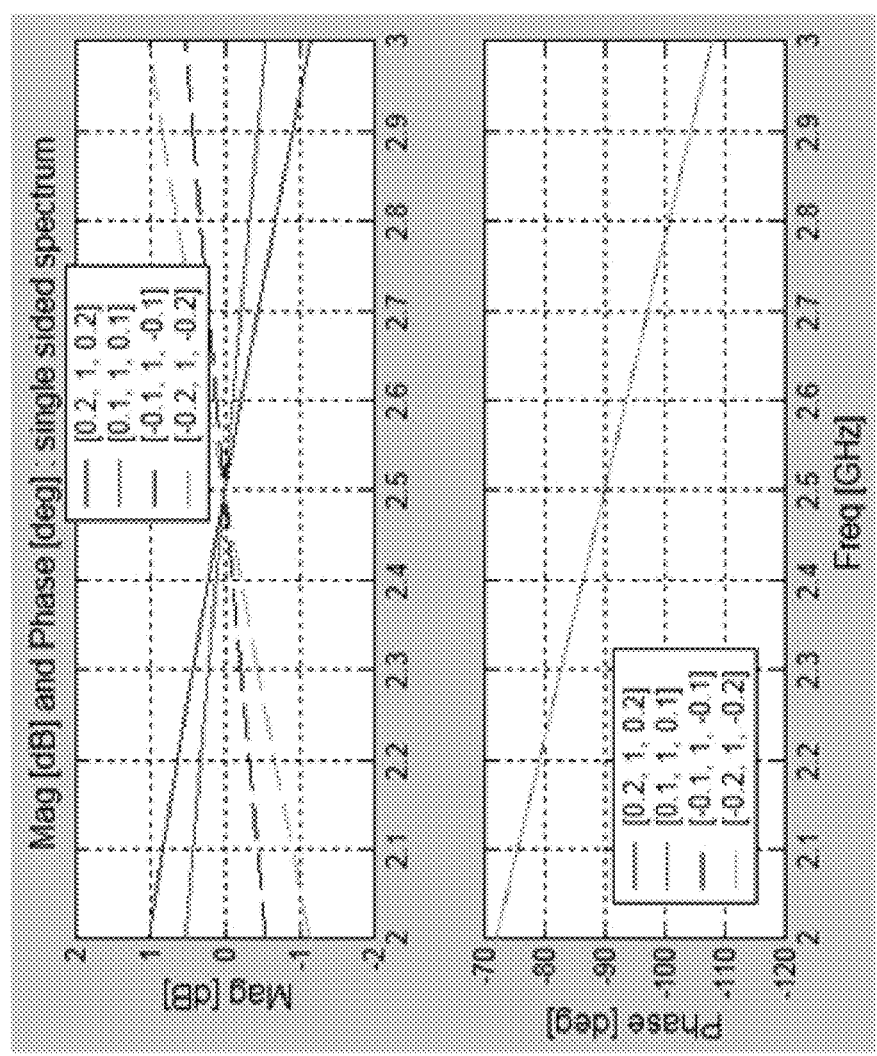
FIG. 6 illustrates three-coefficient AFIR based gain slope adjustment with constant group delay, according to certain embodiments.

Another example on the benefits of using quarter wavelength delay is the constant group delay amplitude slope adjuster AFIR configuration of the proposed ASP-circuit. FIG. 6 illustrates three-coefficient AFIR based gain slope adjustment with constant group delay, according to certain embodiments.

Here, the AFIR structure can be the same as above. A difference can be that now the corner coefficients (h0 and h2) may have the same polarity but equal amplitude. FIG. 6 shows example simulation results. Here also, one can add more odd stages for a still more broadband solution than illustrated. On top of magnitude slope control over bandwidth the output can be scaled just by scaling each coefficient with same scaling factor.

The two examples above used real valued coefficients and quarter wavelength unit delay. In both cases, for full adjustment range the polarity of the coefficients can be changed. If complex coefficients were used, for example reflection type I&Q vector modulators, as AFIR coefficients, yet another possibility may be available. A system could do all, adjust amplitude slope, phase offset and even create negative group delays, with simple pre-defined complex coefficient values.

Certain embodiments can be implemented in various ways. The implementations may depend on a desired complexity of frequency response adjustments. One complex case may be systems with broadband signals. Within these cases, there can be more than one dominant delay. However, the ASP-circuit according to certain embodiments can be used to generate more than one adjustable dominant delay, for example two nominal delays can be dimensioned and the unit delays can be integrated within those nominal delays. Then group of N−M signal paths can be adapted with one nominal delay and fractional delays, while the other group of M signal paths with other nominal delay and fractional delays can be adapted to different nominal delay (refer to FIG. 2 and equation (1) keeping in mind that group of M fractional delays have different nominal delay).

These two groups of N−M and M signal paths can be used to adjust two nominal output delay paths fractionally. Sinc-interpolation may involve more than one fractional delay, if the target delay is not exactly an integer number of one unit delay. Hence, sinc-interpolation may be performed for two different delayed signal paths.

Certain embodiments may involve various aspects. For example, certain embodiments may involve splitting the input signal into N couple of signal paths, complex weighting each signal path signal, fractional delaying each signal within individual signal path, possibly filtering each signal path signal and summing the signal path's outputs.

Two variants of certain embodiments can be achieved if the electrical fractional delay difference between signal paths is selected to be a quarter wavelength long, as was discussed earlier. As mentioned above, Ts can be the unit delay. Such long unit delay is uncommon to DSP FIR solutions because usually high oversampling is required, so that flat amplitude response filters can be achieved. In some cases according to certain embodiments, it may be beneficial to select the unit delay to be 90 degrees, as discussed above.

Figure 7:
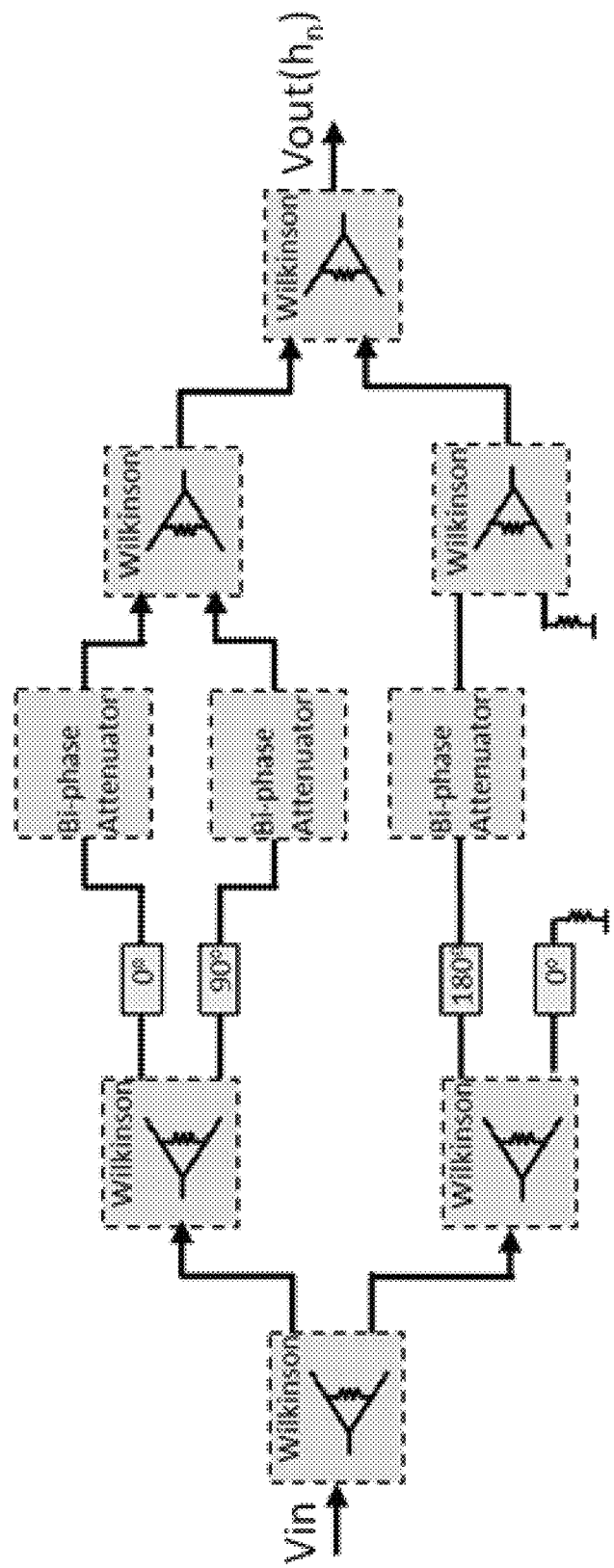
FIG. 7 illustrates an example three-coefficient AFIR architecture, according to certain embodiments.

The first two implementation examples are related to the implementation case where the 90 degree unit delay is used. FIG. 7 illustrates an example three-coefficient AFIR architecture, according to certain embodiments. This architecture may produce the output according to equation (1), set forth above. The AFIR coefficients can be real valued with plus and minus polarity. The unit delay can be 90 degree and three isolated signal paths can be used. The nominal delay can be that of the middle signal path from the input to the output.

A system employing this architecture may be able to perform 0-360 degree phase adjustment while keeping constant group delay and flat frequency response. The coefficient values can be those shown in FIG. 4 above, or directly relative to those through scaling. The coefficient values are described relative to each other. The same architecture can be used to perform constant group delay amplitude slope adjuster response, similar to the one shown in FIG. 6 above. The input and output Wilkinson devices could be replaced with three-way Wilkinson devices, or other devices can also be used. Thus, these particular elements should be understood as illustrations of the general principles without limitation.

Figure 8:
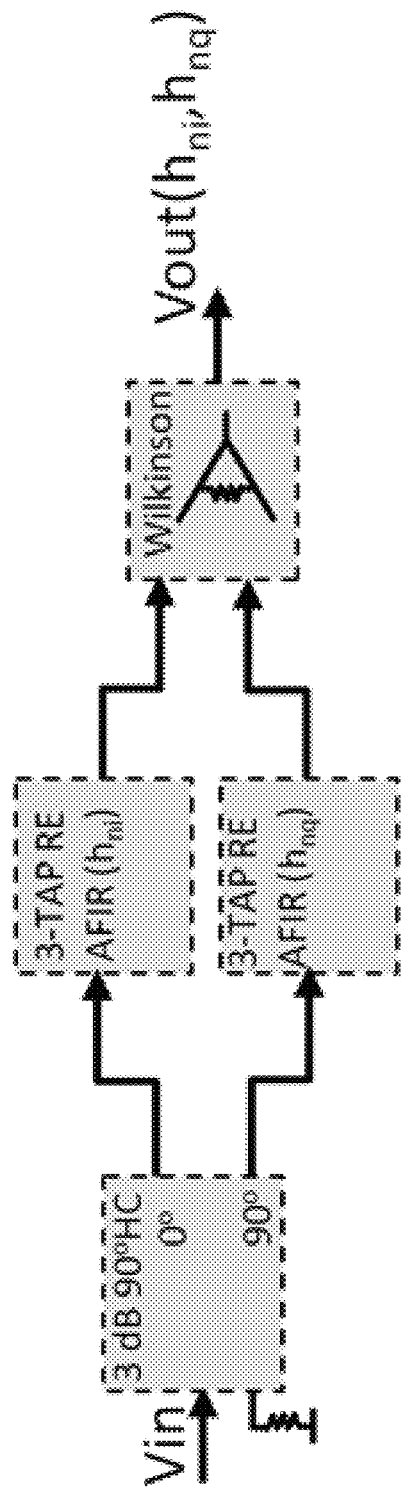
FIG. 8 illustrates a three-complex-coefficients AFIR while using real valued coefficients architecture according to certain embodiments.

FIG. 8 illustrates a three-complex-coefficients AFIR while using real valued coefficients architecture according to certain embodiments. Here, the 3-TAP real-valued element (RE) AFIR(hni,hnq) refers to the 3-coefficient AFIR circuit shown in FIG. 7. The hni and hnq refers to in phase and out of phase (90 degree) signal path coefficients. Thus, in FIG. 8 there can be two 3-coefficient AFIR circuits within isolated paths with 90 degree phase difference. Both of the 3-TAP RE AFIR blocks can have equal group delay but the input signal can be in 90 degree phase offset. Therefore, the architecture of FIG. 8 can be used to adjust both amplitude slope and phase offset (0-360) independently. For example, the upper branch can produce the phase offset as shown in FIGS. 4 and 5, and the lower signal path can be used to produce amplitude slope. Because the outputs of individual AFIRs have the same group delay and because of isolation the total sum output signal is such that both output phase and amplitude slope can be adjusted independently. Hence, vector modulator and amplitude slope adjustment capability is achieved without using vector modulator. Vector modulator generally cannot be used to adjust amplitude slope. Furthermore, the solution can be broad band. These examples are based on a 90 degree unit delay selection. If the unit delay is not 90 degrees, then the solution can be varied accordingly.

Figure 9:
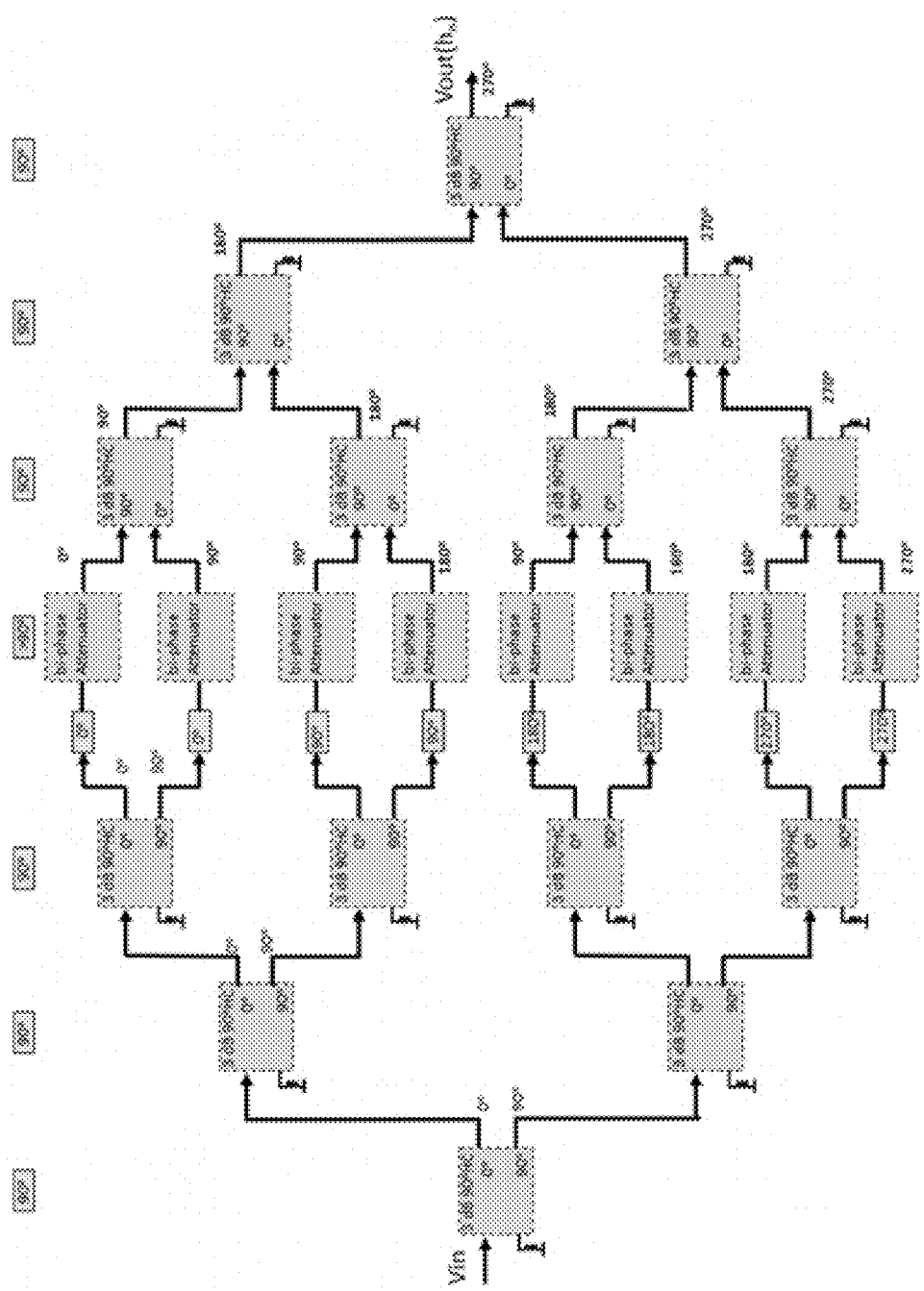
FIG. 9 illustrates an example AFIR architecture block diagram or ASP-circuit, according to certain embodiments.

The next two examples can perform more complex signal shaping capability, while both architectures can follow the response approximation given in equation (1). FIG. 9 illustrates an example AFIR architecture block diagram or ASP-circuit, according to certain embodiments.

Within the circuit shown in FIG. 9, the 90 degree unit delay can still be used. However, due to the delay selection, the system can again effectively achieve complex gain weighting while using only bi-phase attenuators/gain elements. Each signal path group of two having equal fractional delay can form effectively complex gain, or AFIR weight, while using real valued coefficients.

Figure 10:
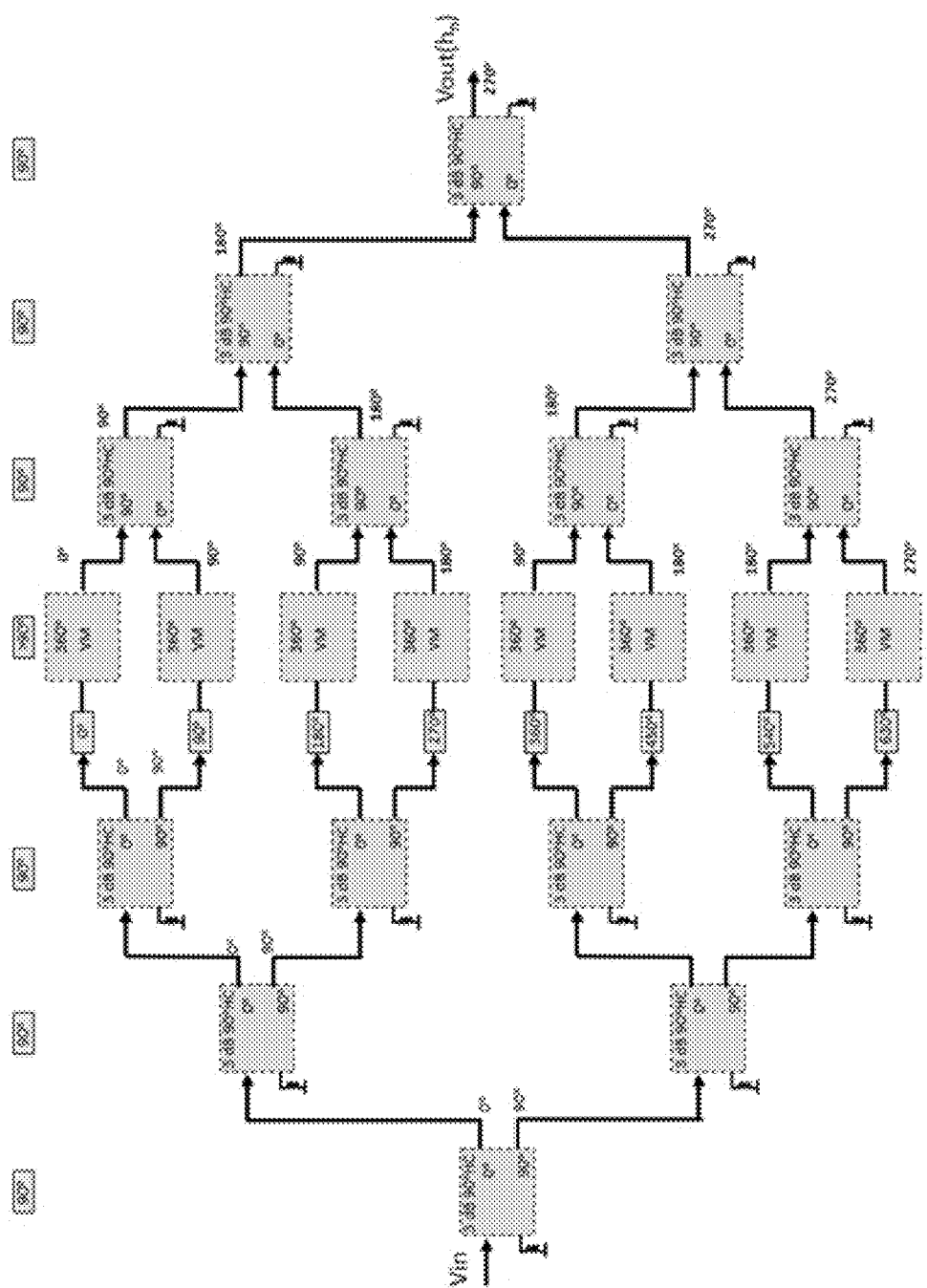
FIG. 10 illustrates another example AFIR architecture block diagram or ASP-circuit, according to certain embodiments.

A further implementation architecture example, shown in FIG. 10, can use complex coefficients. Thus, FIG. 10 illustrates another example AFIR architecture block diagram or ASP-circuit, according to certain embodiments. VM can be I&Q vector modulators, or VM can be 3-coefficient circuit, for example as shown in FIG. 8. The unit delay is illustrated as 90 degrees, although this embodiment may not be dependent on such unit delay being used. Each input signal path to the inputs of unit delay elements can have equal power attenuation. Thus, certain embodiments may have above one unit delay element delay adjustment range while being able to adjust amplitude and phase response as well.

Certain embodiments can be tuned within an adaptation loop. The adaptation can depend on the target use of the ASP-circuit of certain embodiments. The adaptation may not purely rely on a time domain signal. Instead, the frequency content of the signals within the adaptation may be useful for performance optimization in a wanted band.

Certain embodiments may provide a generic ASP-circuit capable of performing FIR-like responses. Therefore, certain embodiments may be integrated as part of many telecommunication systems. For example, certain embodiments may be applied to any system that contains analog domain feedforwarding or system where amplitude and/or phase and/or delay response is adjusted at analog domain. For example within analog domain controlled beamforming solutions, certain embodiments may be deployed.

Figure 11:
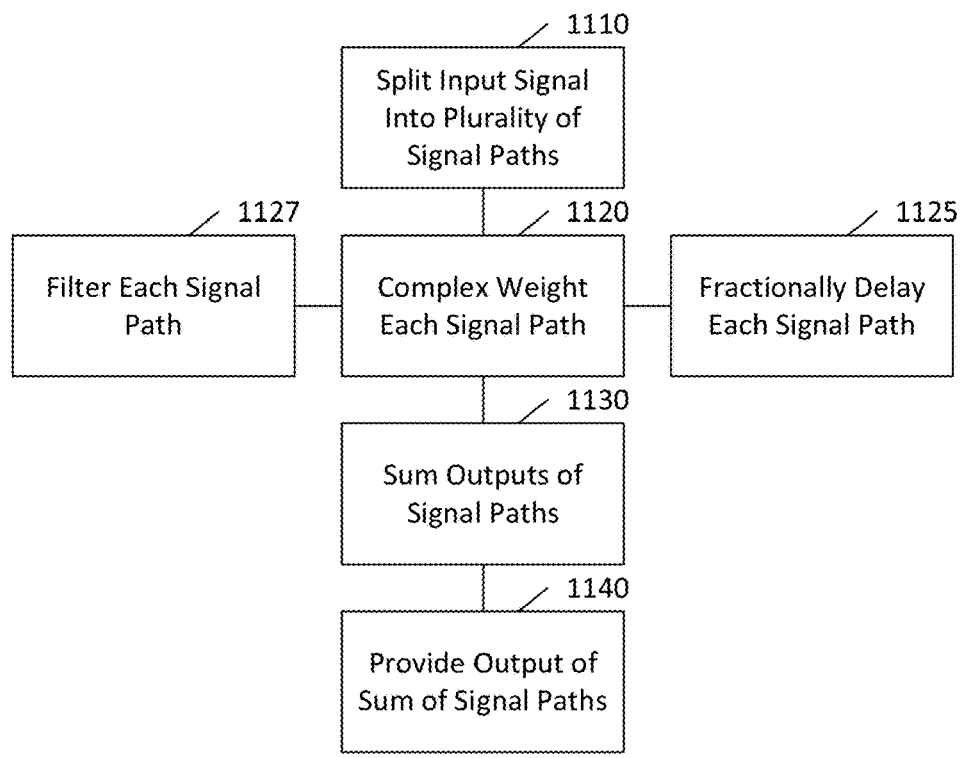
FIG. 11 illustrates a method according to certain embodiments.

FIG. 11 illustrates a method according to certain embodiments. The method of FIG. 11 can be configured to operate at continuous-time domain. As shown in FIG. 11, a method can include, at 1110, splitting an input signal into a plurality of signal paths. These may be the various plurality of paths illustrated in FIGS. 2 and 7-10. The method can also include, at 1120, complex weighting, for each signal path, a respective signal. This complex weighting can further be combined with fractionally delaying, at 1125, each respective signal for each signal path. The elements used for such complex weighting and fractional delaying can be seen illustrated, for example, in FIGS. 2 and 7-10. The complex weighting can further be combined with, at 1127, filtering the respective signal for each signal path.

The method can further include, at 1130, summing outputs of the signal paths. The method can additionally include, at 1140, providing an output comprising the sum of the signal paths. The output can be provided to any feedforward system, such as a transceiver, antenna, or any other communication circuit.

The complex weighting, together with the delaying and filtering, can be configured to independently control gain, phase and delay of the output signal over broadband. Thus, certain embodiments may provide a tunable system.

The fractionally delaying described above can include delaying by one quarter wavelength. The fractional delay in different signal paths can differ from one another.

The method can also include, at 1150, tuning at least one of the gain, phase and delay independently by adjusting at least one of the complex weighting or the fractional delaying. The filtering can also be tuned, if desired, and such filtering can also be used in the tuning of gain, phase, and delay.

Figure 12:
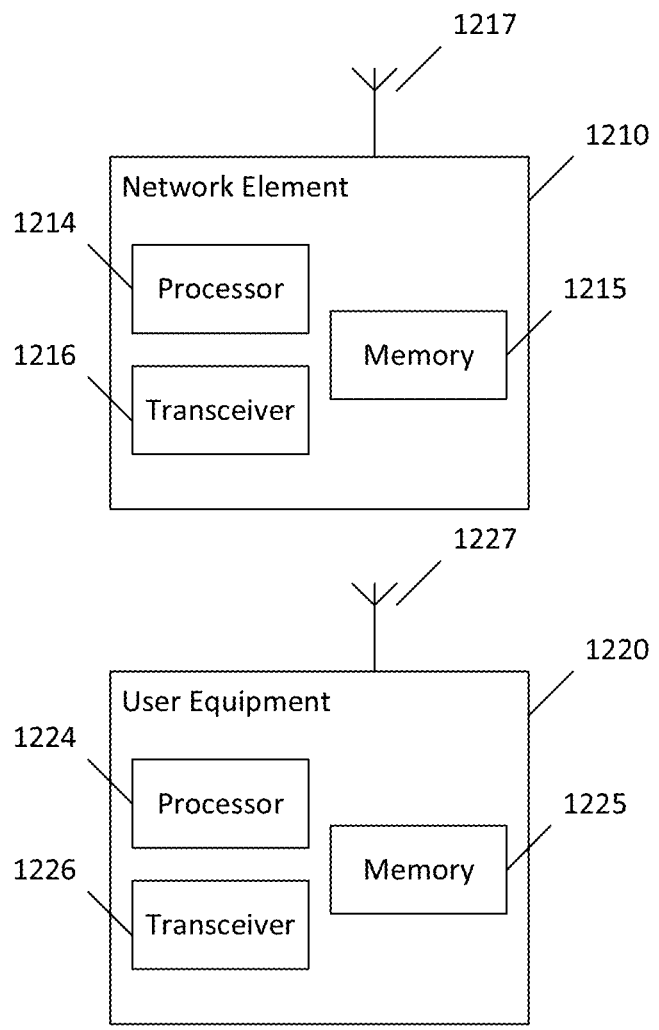
FIG. 12 illustrates a system according to certain embodiments.

FIG. 12 illustrates a system according to certain embodiments of the invention. It should be understood that each block of the diagrams of FIGS. 2 and 7-11 may be implemented by various means or their combinations, such as hardware, software, firmware, one or more processors and/or circuitry. As noted above, analog circuitry may be one way by which many of the described features are implemented, although other elements may be added, or certain analog elements may be replaced by digital elements.

In one embodiment as illustrated in FIG. 12, a system may include several devices, such as, for example, network element 1210 and user equipment (UE) or user device 1220. The system may include more than one UE 1220 and more than one network element 1210, although only one of each is shown for the purposes of illustration. A network element can be an access point, a base station, an eNode B (eNB), or any other network element. Each of these devices may include at least one processor or control unit or module, respectively indicated as 1214 and 1224. At least one memory may be provided in each device, and indicated as 1215 and 1225, respectively. The memory may include computer program instructions or computer code contained therein, for example for carrying out the embodiments described above. One or more transceiver 1216 and 1226 may be provided, and each device may also include an antenna, respectively illustrated as 1217 and 1227. Although only one antenna each is shown, many antennas and multiple antenna elements may be provided to each of the devices. Other configurations of these devices, for example, may be provided. For example, network element 1210 and UE 1220 may be additionally configured for wired communication, in addition to wireless communication, and in such a case antennas 1217 and 1227 may illustrate any form of communication hardware, without being limited to merely an antenna.

Transceivers 1216 and 1226 may each, independently, be a transmitter, a receiver, or both a transmitter and a receiver, or a unit or device that may be configured both for transmission and reception. The transmitter and/or receiver (as far as radio parts are concerned) may also be implemented as a remote radio head which is not located in the device itself, but in a mast, for example. It should also be appreciated that according to the "liquid" or flexible radio concept, the operations and functionalities may be performed in different entities, such as nodes, hosts or servers, in a flexible manner. In other words, division of labor may vary case by case. One possible use is to make a network element to deliver local content. One or more functionalities may also be implemented as a virtual application that is provided as software that can run on a server.

A user device or user equipment 1220 may be a mobile station (MS) such as a mobile phone or smart phone or multimedia device, a computer, such as a tablet, provided with wireless communication capabilities, personal data or digital assistant (PDA) provided with wireless communication capabilities, portable media player, digital camera, pocket video camera, navigation unit provided with wireless communication capabilities or any combinations thereof. The user device or user equipment 1220 may be a sensor or smart meter, or other device that may usually be configured for a single location.

In an exemplifying embodiment, an apparatus, such as a node or user device, may include means for carrying out embodiments described above in relation to FIGS. 2 and 7-11.

Processors 1214 and 1224 may be embodied by any computational or data processing device, such as a central processing unit (CPU), digital signal processor (DSP), application specific integrated circuit (ASIC), programmable logic devices (PLDs), field programmable gate arrays (FPGAs), digitally enhanced circuits, or comparable device or a combination thereof. The processors may be implemented as a single controller, or a plurality of controllers or processors. Additionally, the processors may be implemented as a pool of processors in a local configuration, in a cloud configuration, or in a combination thereof.

For firmware or software, the implementation may include modules or unit of at least one chip set (e.g., procedures, functions, and so on). Memories 1215 and 1225 may independently be any suitable storage device, such as a non-transitory computer-readable medium. A hard disk drive (HDD), random access memory (RAM), flash memory, or other suitable memory may be used. The memories may be combined on a single integrated circuit as the processor, or may be separate therefrom. Furthermore, the computer program instructions may be stored in the memory and which may be processed by the processors can be any suitable form of computer program code, for example, a compiled or interpreted computer program written in any suitable programming language. The memory or data storage entity is typically internal but may also be external or a combination thereof, such as in the case when additional memory capacity is obtained from a service provider. The memory may be fixed or removable.

The memory and the computer program instructions may be configured, with the processor for the particular device, to cause a hardware apparatus such as network element 1210 and/or UE 1220, to perform any of the processes described above (see, for example, FIGS. 2 and 7-11). Therefore, in certain embodiments, a non-transitory computer-readable medium may be encoded with computer instructions or one or more computer program (such as added or updated software routine, applet or macro) that, when executed in hardware, may perform a process such as one of the processes described herein. Computer programs may be coded by a programming language, which may be a high-level programming language, such as objective-C, C, C++, C#, Java, etc., or a low-level programming language, such as a machine language, or assembler. Alternatively, certain embodiments of the invention may be performed entirely in hardware.

Furthermore, although FIG. 12 illustrates a system including a network element 1210 and a UE 1220, embodiments of the invention may be applicable to other configurations, and configurations involving additional elements, as illustrated and discussed herein. For example, multiple user equipment devices and multiple network elements may be present, or other nodes providing similar functionality, such as nodes that combine the functionality of a user equipment and an access point, such as a relay node.

One having ordinary skill in the art will readily understand that the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

LIST OF ABBREVIATIONS

AFIR analog FIR-filter
ASP Analog signal processing
FIR Finite Impulse Response (filter)
IIR Infinite Impulse Response (filter)
DSP Digital Signal Processing
HW Hardware (HW tuning refers to physically alter the Hardware, for example RF layout)
VM I&Q vector modulator

We claim:

1. A method, comprising:
splitting an input signal into a plurality of signal paths;
complex weighting, for each signal path of the plurality of signal paths, a respective signal;
fractionally delaying each respective signal for each signal path;
summing outputs of each of the signal paths; and
providing an output signal comprising the sum of the signal paths, wherein
the complex weighting is configured to independently control gain, phase, and delay of the output signal over broadband, and
the complex weighting is adjusted to create at least one negative group delay.

2. The method of claim 1, wherein the fractionally delaying comprises delaying by one quarter wavelength.

3. The method of claim 1, further comprising:
tuning at least one of the gain, phase, and delay independently by adjusting the fractional delaying.

4. The method of claim 1, further comprising:
filtering the respective signal for each signal path.

5. The method of claim 1, wherein the method is configured to operate in a continuous-time domain.

6. The method of claim 1, wherein the plurality of signal paths comprises at least three signal paths.

7. The method of claim 1, wherein each signal path comprises at least one three-tap real-valued element analog finite impulse response element.

8. An apparatus, comprising:
a splitter configured to split an input signal into a plurality of signal paths at a first end of the signal paths, wherein each signal path of the plurality of signal paths comprises at least one attenuator and at least one delay element; and
a summer configured to sum the signal paths at a second end of the signal paths opposite the first end of the signal paths, wherein
the delay element for each signal path is configured to fractionally delay a respective signal for each signal path,
the apparatus is configured to independently control gain, phase, and delay of an output signal over broadband, and
complex weighting is adjusted to create at least one negative group delay.

9. The apparatus of claim 8, wherein the fractionally delaying comprises delaying by one quarter wavelength.

10. The apparatus of claim 8, wherein the apparatus is configured to tune at least one of the gain, phase, and delay independently by adjusting the fractional delaying.

11. The apparatus of claim 8, further comprising:
a filter for each signal path configured to filter the respective signal for each signal path.

12. The apparatus of claim 8, wherein the apparatus is configured to operate in a continuous-time domain.

13. The apparatus of claim 8, wherein the plurality of signal paths comprises at least three signal paths.

14. The apparatus of claim 8, wherein the apparatus comprises a three-tap real-valued element analog finite impulse response element.

15. The apparatus of claim 8, wherein each signal path comprises at least one three-tap real-valued element analog finite impulse response element.

16. An apparatus, comprising:
means for splitting an input signal into a plurality of signal paths;
means for complex weighting, for each signal path of the plurality of signal paths, a respective signal;
means for fractionally delaying each respective signal for each signal path;
means for summing outputs of each of the signal paths; and
means for providing an output signal comprising the sum of the signal paths, wherein
the complex weighting is configured to independently control gain, phase, and delay of the output signal over broadband, and
the complex weighting is adjusted to create at least one negative group delay.

17. The apparatus of claim 16, wherein the fractionally delaying comprises delaying by one quarter wavelength.

18. The apparatus of claim 16, further comprising:
means for tuning at least one of the gain, phase, and delay independently by adjusting the fractional delaying.

19. The apparatus of claim 16, further comprising:
means for filtering the respective signal for each signal path.

20. The apparatus of claim 16, wherein the apparatus is configured to operate in a continuous-time domain.

* * * * *